(12) United States Patent
Mallik et al.

(10) Patent No.: US 7,345,361 B2
(45) Date of Patent: Mar. 18, 2008

(54) STACKABLE INTEGRATED CIRCUIT PACKAGING

(75) Inventors: Debendra Mallik, Chandler, AZ (US); Kinya Ichikawa, Tsukuba (JP); Terry L. Sterrett, Cave Creek, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/728,324

(22) Filed: Dec. 4, 2003

(65) Prior Publication Data
US 2005/0121764 A1  Jun. 9, 2005

(51) Int. Cl.
*H01L 23/02* (2006.01)
(52) U.S. Cl. ............... 257/686; 257/777; 228/180.1
(58) Field of Classification Search ............ 257/685, 257/686, 738, 777, 781
See application file for complete search history.

(56) References Cited

U.S. PATENT DOCUMENTS

| | | | | |
|---|---|---|---|---|
| 5,040,052 A | * | 8/1991 | McDavid | 361/793 |
| 5,422,435 A | * | 6/1995 | Takiar et al. | 174/52.4 |
| 5,641,113 A | * | 6/1997 | Somaki et al. | 228/180.22 |
| 6,489,676 B2 | * | 12/2002 | Taniguchi et al. | 257/698 |
| 7,145,225 B2 | * | 12/2006 | Lee | 257/686 |
| 2002/0135057 A1 | * | 9/2002 | Kurita | 257/685 |
| 2002/0196650 A1 | * | 12/2002 | Chang | 365/63 |

* cited by examiner

*Primary Examiner*—Leonardo Andujar
(74) *Attorney, Agent, or Firm*—Buckley, Maschoff & Talwalkar LLC

(57) ABSTRACT

A system may include an integrated circuit die, an integrated circuit package coupled to the integrated circuit die, mold compound in contact with the integrated circuit die and the integrated circuit package, and an interconnect coupled to the integrated circuit package. A first portion of the interconnect may be in contact with the mold compound, a second portion of the interconnect might not contact the mold compound, and a third portion of the interconnect may be in contact with the integrated circuit package.

13 Claims, 15 Drawing Sheets

STACKABLE INTEGRATED CIRCUIT PACKAGING

BACKGROUND

An integrated circuit (IC) packaging system electrically couples an IC die to various external elements, and may also provide thermal and physical protection to the IC die. In order to increase processing power and/or functionality within a given footprint, an IC packaging system may support two or more IC die. For example, a "stacked die" IC packaging system may include an IC package with two or more IC die stacked thereon. According to another example, a "stacked package" IC packaging system may include several IC packages stacked on one another, with each IC package having one or more IC die stacked thereon, and with adjacent IC packages being separated by a solid polymer interposer including conductive plugs for electrically coupling the adjacent IC packages.

The foregoing IC packaging systems may present characteristics that may be undesirable in certain scenarios. These characteristics may include: limits on the relative sizes of adjacent IC die; wire bonding congestion on one or more IC packages; long wirebonds; inefficient fabrication processes; and/or limited ability to test IC die prior to final packaging.

DETAILED DESCRIPTION

Figure 1:
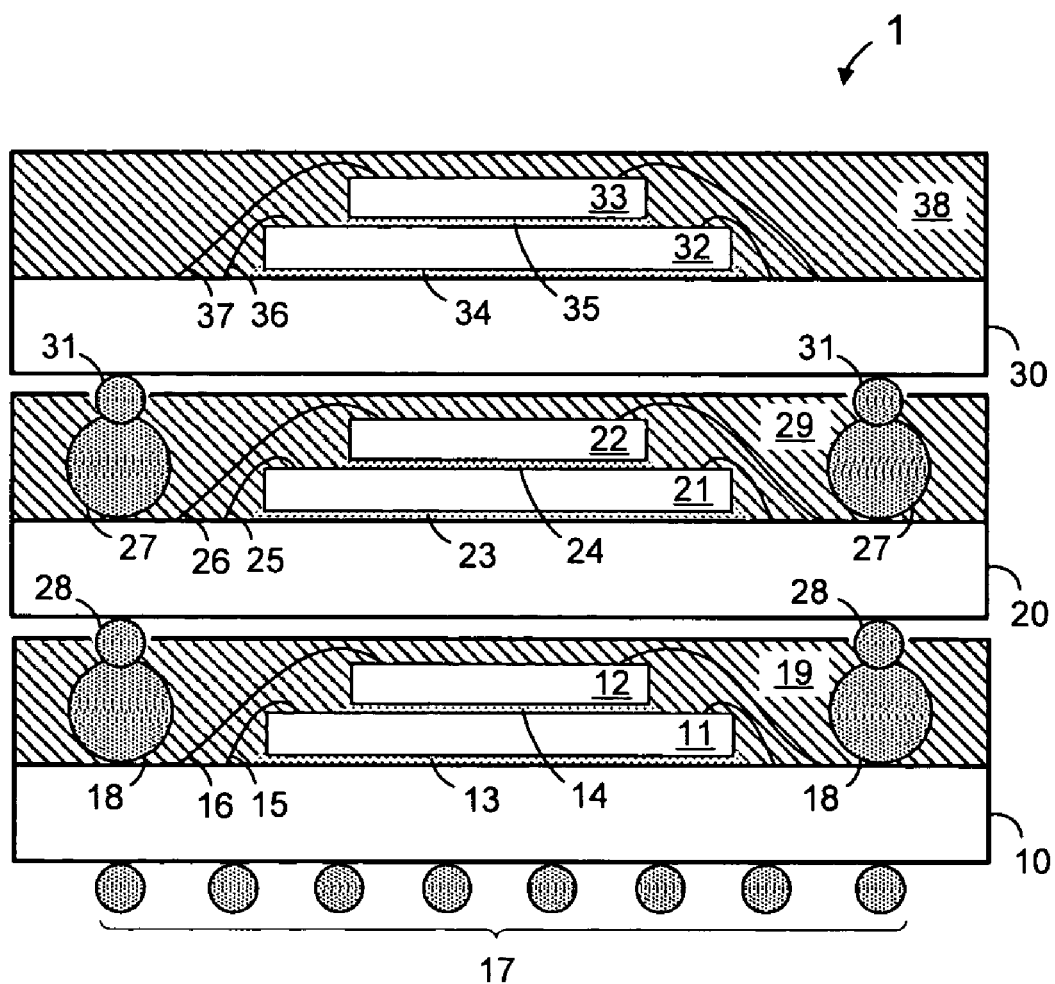
FIG. 1 is a side cross-sectional view of an apparatus according to some embodiments.

FIG. 1 is a cross-sectional side view of apparatus 1 according to some embodiments. Apparatus 1 includes IC package 10 supporting IC die 11 and IC die 12. IC die 11 and IC die 12 may include integrated active and/or passive electrical devices and may be fabricated using any suitable material and fabrication techniques. IC die 10 and IC die 11 may comprise any integrated electrical devices having any function. In some embodiments, IC die 11 comprises a microprocessor having a silicon substrate and IC die 12 comprises a cache memory having a silicon substrate.

IC die 11 is coupled to IC package 10 by die attach material 13, which may comprise a die attach paste, film, or other material. IC die 11 is electrically coupled to IC package 10 by wirebonds 15. More specifically, an upper surface of IC die 11 includes electrical contacts (not shown) that are electrically coupled to the electrical devices integrated within IC die 11. Wirebonds 15 are attached to respective ones of the electrical contacts and to respective electrical contacts (not shown) disposed on an upper surface of IC package 10.

Similarly, IC die 21 is coupled to IC die 11 by die attach material 14, and is electrically coupled to IC package 10 by wirebonds 16. Wirebonds 16 are attached to respective ones of electrical contacts of IC die 12 and to respective electrical contacts (not shown) disposed on an upper surface of IC package 10. In some embodiments, one or more of wirebonds 16 electrically couples an electrical contact of IC die 12 to an electrical contact of IC die 11.

IC package 10 may comprise any ceramic, organic, and/or other suitable material. IC package 10 comprises solder balls 17 for carrying power and I/O signals between elements of apparatus 1 and external devices. For example, solder balls 17 may be mounted directly to a motherboard (not shown) or onto an interposer that is in turn mounted directly to a motherboard. Alternative interconnects such as through-hole pins may be used instead of solder balls 17 to mount apparatus 1 to a motherboard, a socket, or another substrate.

Interconnects 18 are coupled to IC package 10. Interconnects 18 may comprise any suitable conductive material. According to some embodiments, interconnects 18 comprise solder material. Although interconnects 18 are illustrated as being substantially spherical, interconnects 18 may possess any suitable shape.

One or more of interconnects 18 may be coupled to an electrical contact of IC package 10. In this regard, the electrical contacts of IC package 10 may be electrically coupled to electrical traces and routing vias within IC package 10. The traces and vias may electrically couple the electrical contacts to one or more of another electrical contact, solder balls 17, and interconnects 18.

Mold compound 19 is in contact with IC die 11, IC die 12, die attach material 13, die attach material 14, wirebonds 15 and 16, and interconnects 18. In some embodiments, mold compound 19 surrounds a perimeter of IC die 11 and IC die 12. Mold compound 19 may comprise a stiff material that provides stiffness to apparatus 1 and physical protection to the elements thereof.

Apparatus 1 also includes IC package 20 supporting IC die 21 and IC die 22, which may include integrated active and/or passive electrical devices and may be fabricated using any suitable material and fabrication techniques. IC die 21 is coupled to IC package 20 by die attach material 23, and IC die 22 is coupled to IC die 21 by die attach material 24. IC die 21 and IC die 22 are electrically coupled to electrical contacts of IC package 20 by wirebonds 25 and wirebonds 26, respectively. One or more of wirebonds 26 may electrically couple IC die 22 to IC die 21. In some embodiments, IC package 20 is coupled to mold compound 19.

Interconnects 27 may also be coupled to electrical contacts of IC package 20. Interconnects 27 may comprise any suitable conductive material of any suitable shape, including but not limited to spherical solder material. Solder balls 28 are also interconnects and may be electrically coupled to one or more electrical contacts of IC package 20 and to interconnects 18 for electrically coupling IC package 20 to interconnects 18. Mold compound 19 defines openings through which solder balls 28 may contact interconnects 18. As a result of the foregoing arrangement, a first portion of at least one of interconnects 18 is in contact with mold compound 19, a second portion is not in contact with mold compound 19, and a third portion is in contact with IC package 10. According to the embodiment of FIG. 1, the above-mentioned second portion is in contact with one of solder balls 28.

The electrical contacts of IC package 20 may be electrically coupled to electrical traces and routing vias within IC package 20. The traces and vias may electrically couple the electrical contacts to another electrical contact of IC package 20, to an interconnect 27, and/or to a solder ball 28. For example, according to some embodiments, traces and vias electrically couple one or more of interconnects 27 at least to one of solder balls 28.

Mold compound 29 is in contact with IC die 21, IC die 22, die attach material 23, die attach material 24, wirebonds 25 and 26, and interconnects 27. Mold compound 29 may surround a perimeter of IC die 21 and IC die 22. A first portion of at least one of interconnects 27 is in contact with mold compound 29, a second portion is not in contact with mold compound 29, and a third portion is in contact with IC package 20. The second portion is in contact with one of solder balls 31 coupled to IC package 30.

IC package 30 supports IC die 32 and IC die 33, which may include integrated active and/or passive electrical devices and may be fabricated using any suitable material and fabrication techniques. IC die 32 is coupled to IC package 30 by die attach material 34, and IC die 33 is coupled to IC die 32 by die attach material 35. IC die 32 and IC die 33 are electrically coupled to electrical contacts of IC package 30 by wirebonds 36 and wirebonds 37, respectively. Mold compound 38 is in contact with IC die 32, IC die 33, die attach material 34, die attach material 35, and wirebonds 36 and 37. Mold compound 38 may surround a perimeter of IC die 32 and IC die 33, and may provide stiffness to apparatus 1 and physical protection to the elements thereof.

According to some embodiments, one or more of the IC die of apparatus 1 are "flip-chip" IC die. A flip-chip IC die may be electrically coupled to an adjacent IC die or IC package by an array of solder bumps affixed to the flip-chip IC die. Underfill material may be used to encapsulate the electrical coupling and to assist the mechanical coupling between the flip-chip IC die 10 and the adjacent IC die or IC package.

Figure 2:
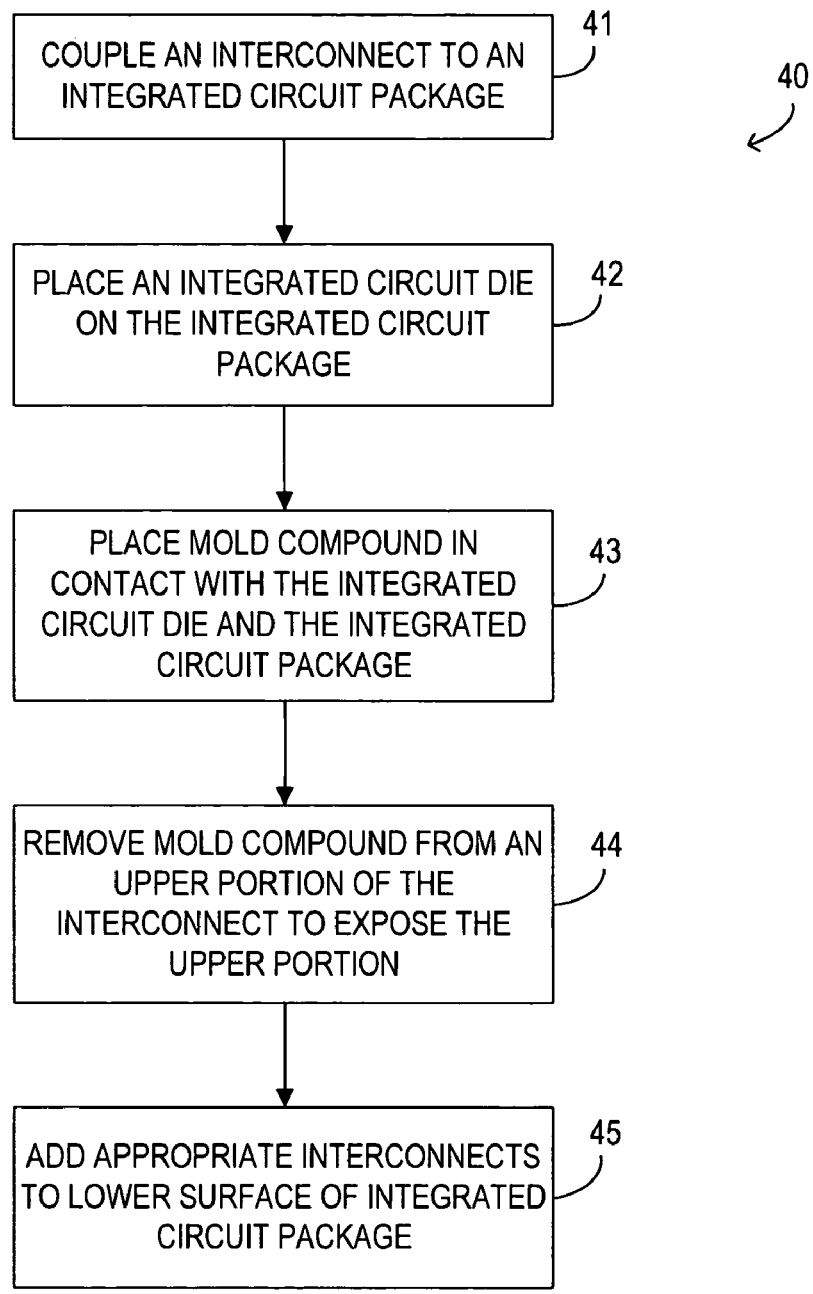
FIG. 2 is a diagram of a process according to some embodiments.

FIG. 2 is a diagram of process 40 to fabricate an apparatus according to some embodiments. Process 40 may be executed by one or more devices, and all or a part of process 40 may be executed manually. Process 40 may be executed by an entity different from an entity that manufactures the IC die used therein.

Figure 3:
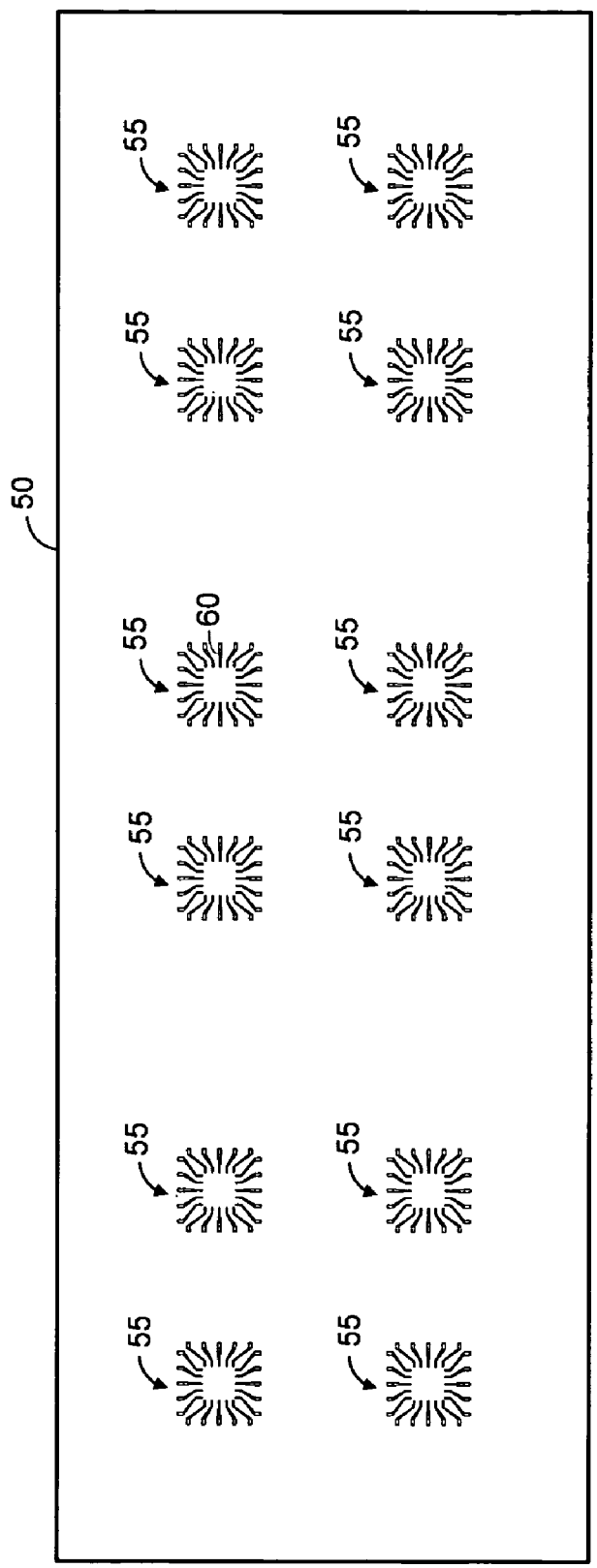
FIG. 3 is a top view of an IC package substrate according to some embodiments.

Initially, at 41, an interconnect is coupled to an IC package. FIG. 3 shows IC package substrate 50 and integral IC packages 55 according to some embodiments of 41. IC package substrate 50 may be composed of any suitable IC package material, including but not limited to an organic laminated glass-weave polymer.

IC packages 55 are disposed in a matrix array package (MAP) configuration. IC packages 55 include electrical contacts 60 disposed on upper surfaces thereof. Electrical contacts 60 of an IC package 55 may comprise any type of electrical contacts for electrically coupling elements to routing vias and electrical traces within the IC package substrate 55. According to some embodiments, IC package substrate 50 and electrical contacts 60 may be fabricated using any currently- or hereafter-known MAP fabrication method.

Figure 4:
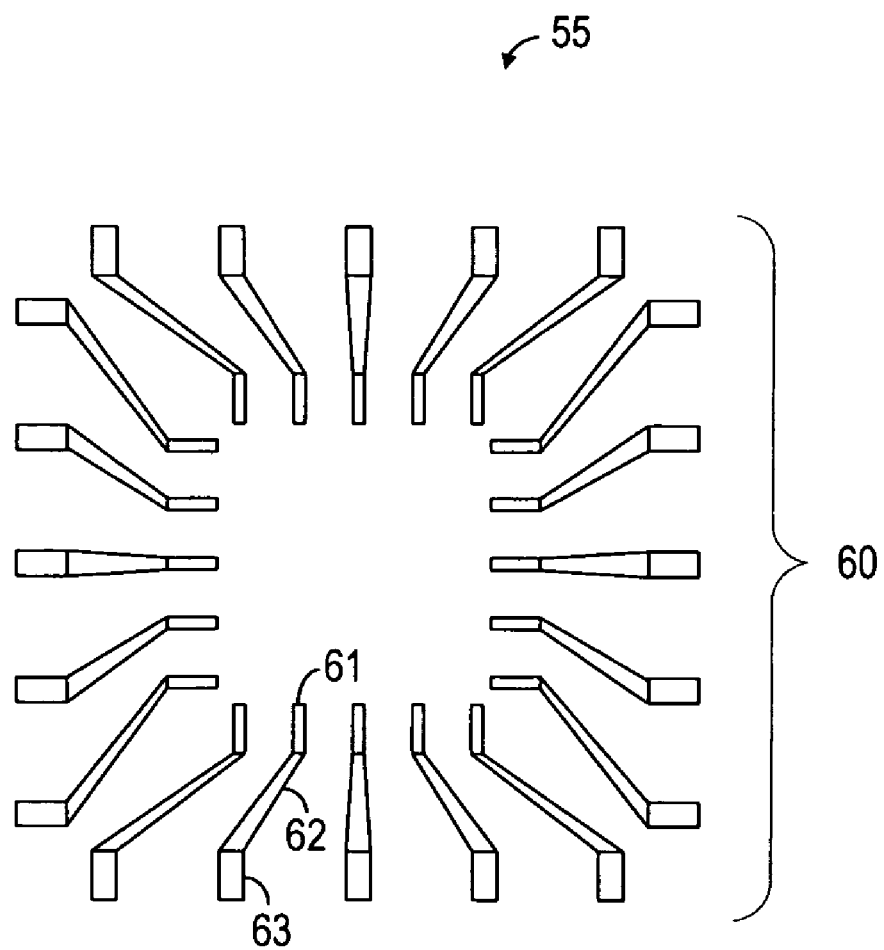
FIG. 4 is a close-up view of an IC package substrate according to some embodiments.

FIG. 4 is a close-up view of electrical contacts 60 of one IC package 55 according to some embodiments. Each of electrical contacts 60 comprises wirebond pad 61, fan-out trace 62, and interconnect bonding pad 63. Fan-out trace 62 may be disposed under an upper surface of IC package 55 according to some embodiments. Some embodiments of IC package 55 may include more or fewer electrical contacts 60 than shown.

Moreover, some embodiments of electrical contacts 60 lack one or more of wirebond pad 61, fan-out trace 62, and interconnect bonding pad 63. For example, an electrical contact 60 may include only wirebond pad 61, only wirebond pad 61 and interconnect pad 63, which may or may not be electrically coupled, only interconnect pad 63, or elements in another configuration. In some embodiments, electrical contacts 60 may comprise an array suitable for coupling to a flip-chip IC die. An electrical contact 60 of an IC package 55 may be electrically coupled to one or more of another electrical contact 60 of the IC package 55, a via within the IC package 55, a solder ball coupled to a lower surface of the IC package 55, and other electrical elements.

At 41, an interconnect may be placed on one or more of electrical contacts 60 of an IC package 55. The interconnect may be similar to interconnects 18 and 27 described with respect to FIG. 1. The interconnect may be fabricated on the one or more of electrical contacts 60 according to some embodiments. An interconnect need not be placed on each electrical contact 60 according to some embodiments. Moreover, some embodiments include interconnects placed in a non-symmetrical arrangement on an IC package 55.

Figure 5:
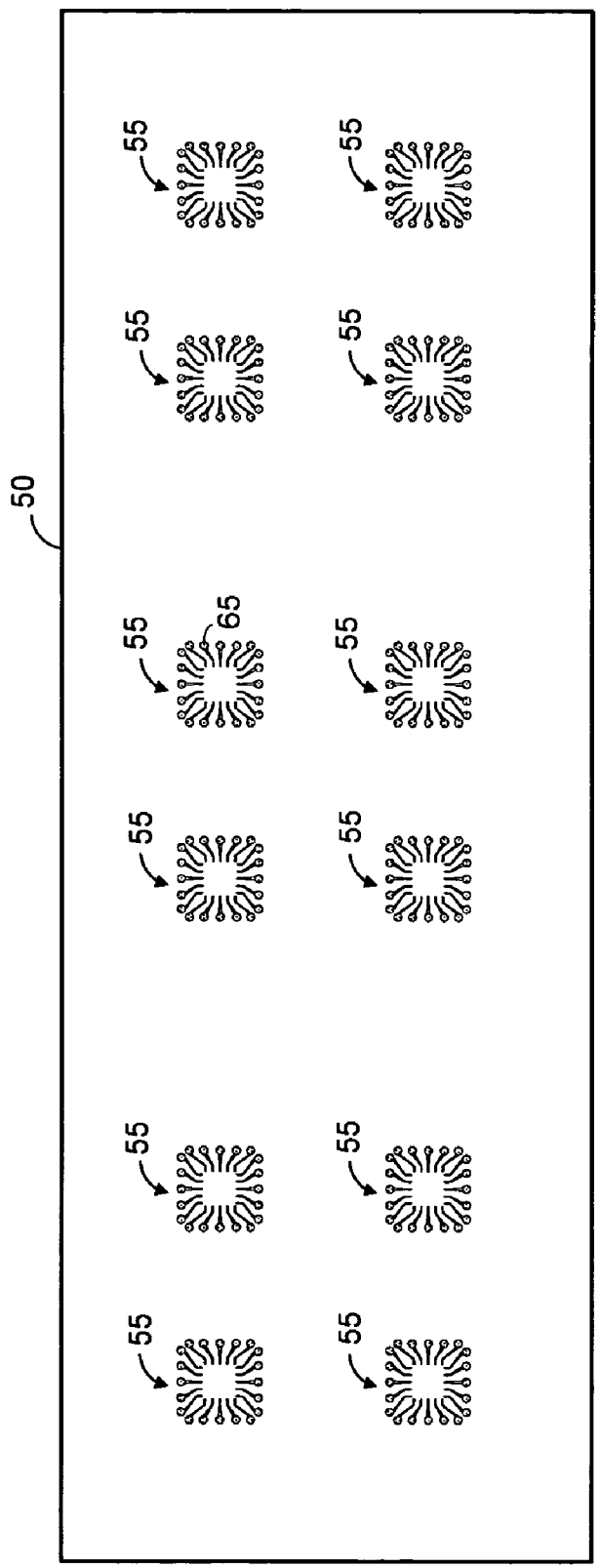
FIG. 5 is a top view of an IC package substrate having a plurality of interconnects attached thereto according to some embodiments.

FIG. 5 is a top view of substrate 50 after 41. Accordingly, interconnects 65 are shown coupled to IC packages 55. As mentioned above, one or more of interconnects 65 are coupled to a respective one or more of electrical contacts 60. In some embodiments, one or more IC packages 55 of substrate 50 include a different configuration of electrical contacts 60 than at least one other IC package 55. In addition, an arrangement of interconnects 65 on at least one of IC packages 55 may differ from an arrangement of interconnects 65 on at least one other of IC packages 55. An arrangement of interconnects 65 on two IC packages 55 may differ even in a case that the two IC packages 55 include an identical configuration of electrical contacts 60.

Figure 6:
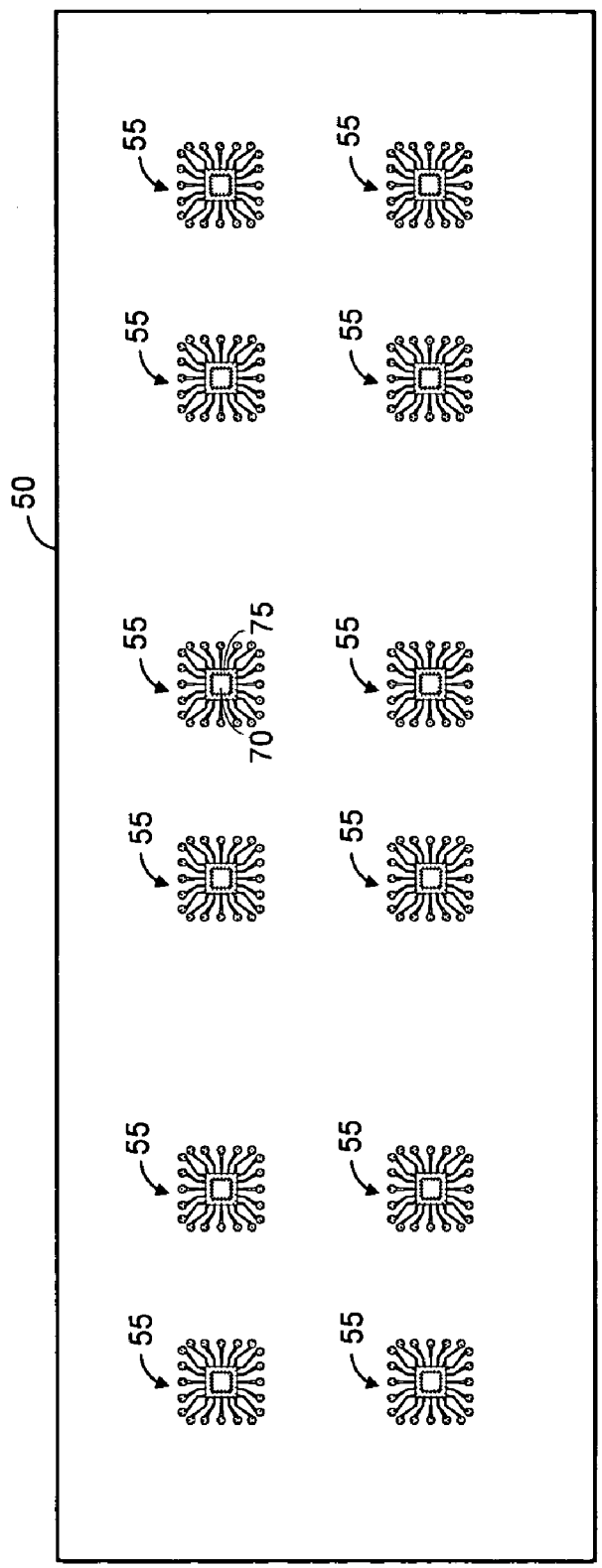
FIG. 6 is a top view of an IC package substrate having a plurality of IC die attached thereto according to some embodiments.
Figure 7:
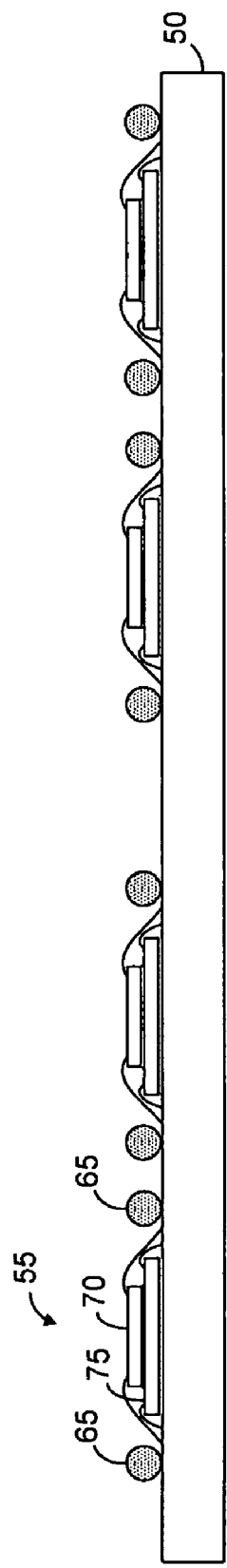
FIG. 7 is a side cross-sectional view of an IC package substrate, a plurality of IC die, and a plurality of interconnects according to some embodiments.

An IC die is placed on an IC package 55 at 42. One or more IC die may be placed on an IC package at 42. FIG. 6 shows IC die 70 and IC die 75 placed on each IC package 55 of IC package substrate 50. The IC die may be placed on respective ones of IC packages 55 using a pick-and-place machine. As described with respect to FIG. 1, die attach material may be placed on an IC package 55 or on an IC die prior to placing an IC die thereon. FIG. 6 also shows wirebonds between an IC die 70 and a respective IC package 55 and between an IC die 70 and a respective IC die 75. The number of die, type of die, and/or wirebond arrangement associated with an IC package 55 may differ from at least one other IC package 55. FIG. 7 is a cross-sectional side view further illustrating the arrangement of IC packages 55, interconnects 65, IC die 70, and IC die 75 after 42 and according to some embodiments.

In a case that one or more of the IC die placed at 42 is a flip-chip die, underfill material may be thereafter dispensed on a corresponding IC package substrate 50 adjacent to the one or more IC die. The dispensed underfill material may comprise a capillary flow underfill material according to some embodiments, and energy may be applied thereto to transform the material into a protective inert polymer.

Figure 8:
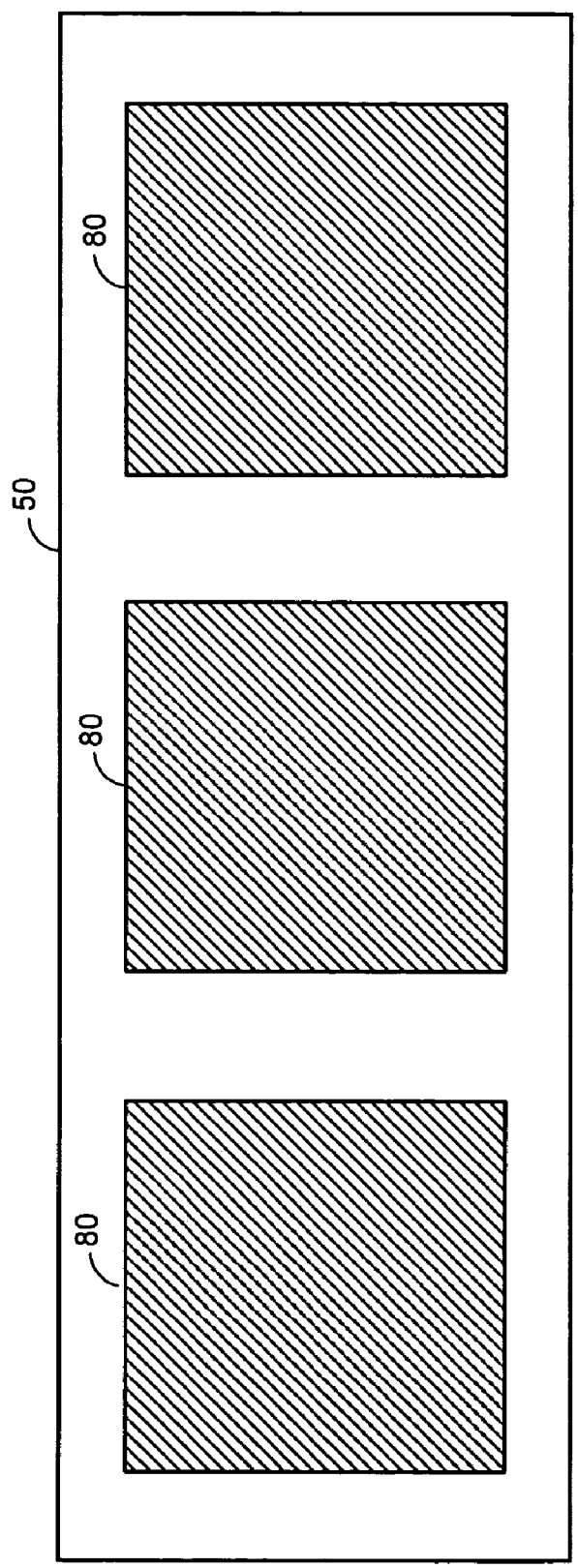
FIG. 8 is a top view of an IC package substrate and mold compound according to some embodiments.
Figure 9:
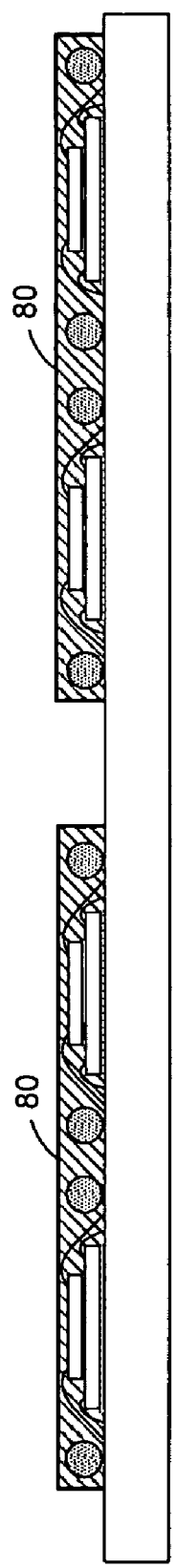
FIG. 9 is a side cross-sectional view of an apparatus according to some embodiments.

At 43, mold compound is placed in contact with an IC package and with IC die coupled to the IC package. FIG. 8 illustrates an embodiment in which a mold is used to place a portion of mold compound 80 in contact with each "cluster" of IC packages 55 of IC package substrate 50. FIG. 9 is a cross-sectional side view of the FIG. 8 apparatus. As shown, mold compound 80 is in contact with IC package 55, interconnects 65, IC die 70, and IC die 75.

Mold compound 80 may be fully or partially cured at 43 in order to provide a suitable amount of physical stability to mold compound 80. Curing may involve subjecting mold compound 80 to elevated temperatures. In some embodiments, interconnects 65 are also reflowed at 43 to improve a physical and an electrical connection between interconnects 65 and corresponding ones of electrical contacts 60. Interconnects 65 and/or electrical connections between IC die 70, IC die 75, and IC package 55 may be partially and/or completely reflowed prior to 43. Curing/reflow temperatures and sequences may depend on the specific fabrication techniques and materials used in various embodiments.

Figure 10A:
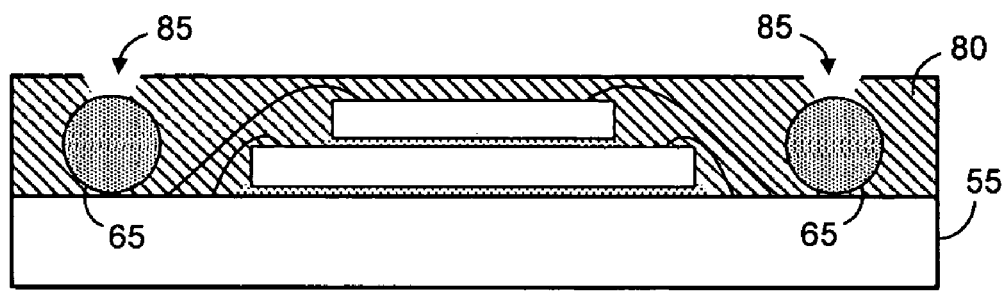
FIG. 10A is a side cross-sectional view of an apparatus according to some embodiments.
Figure 10B:
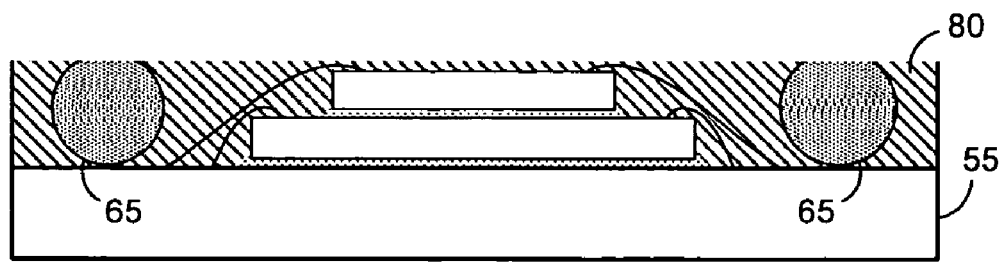
FIG. 10B is a side cross-sectional view of an apparatus according to some embodiments.

Next, at 44, mold compound 80 is removed from an upper portion of an interconnect to expose the upper portion. FIGS. 10A and 10B illustrate two different embodiments of 44. In FIG. 10A, portions of mold compound 80 are removed by laser drilling and/or etching techniques. The removal creates openings 85 in mold compound 80, which extend to interconnects 65. FIG. 10B shows mold compound 80 and interconnects 65 after grinding at 44. The embodiments of FIG. 10A and FIG. 10B result in an exposed upper portion of interconnects 65. Moreover, a first portion of at least one of interconnects 65 is in contact with mold compound 80, a second portion is not in contact with mold compound 80, and a third portion is in contact with IC package 55.

Figure 11:
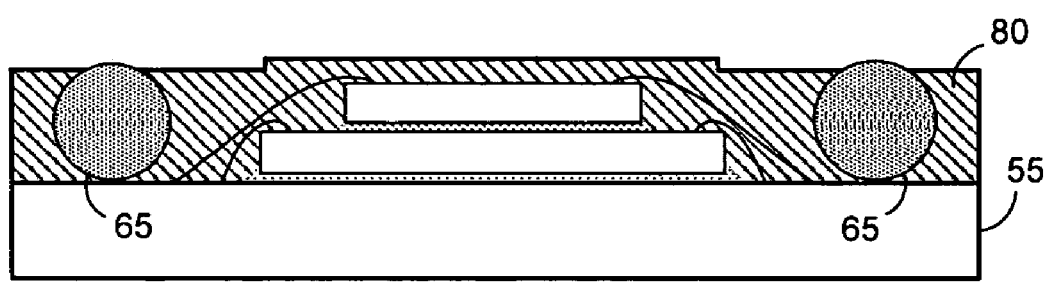
FIG. 11 is a side cross-sectional view of an apparatus according to some embodiments.

FIG. 11 illustrates an embodiment in which process 40 proceeds directly from 43 to 45. In this regard, mold compound 80 placed on IC package 55 presents a varying vertical profile. The vertical profile is lower than a vertical height of interconnects 65 at certain positions, which results in the exposure of an upper surface of interconnects 65 after 43.

Figure 12:
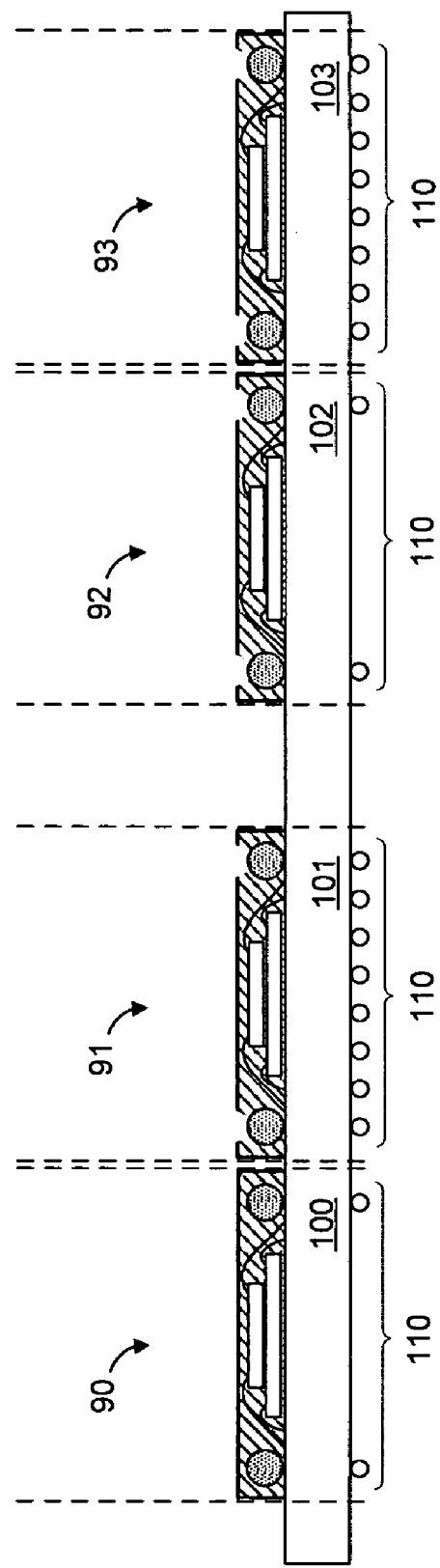
FIG. 12 is a side cross-sectional view of an IC package substrate, a plurality of IC die, and a plurality of interconnects according to some embodiments.

Appropriate interconnects are then added to a lower surface of an IC package 55 at 45. The interconnects may be added depending on a design of an apparatus in which IC package 55 is to be assembled. FIG. 12 is a side cross-sectional view of IC systems 90 through 93 and associated IC packages 100 through 103 according to some embodiments. Interconnects such as solder balls 110 have been attached to corresponding electrical contacts (not shown) of IC packages 100 through 103 using currently- or hereafter-known techniques, and in accordance with the apparatus in which IC systems 91 through 93 will be assembled. As noted above, the IC die, electrical contacts, vias, and inter-package conductive traces of each IC system may differ from those of another IC system.

Figure 13:
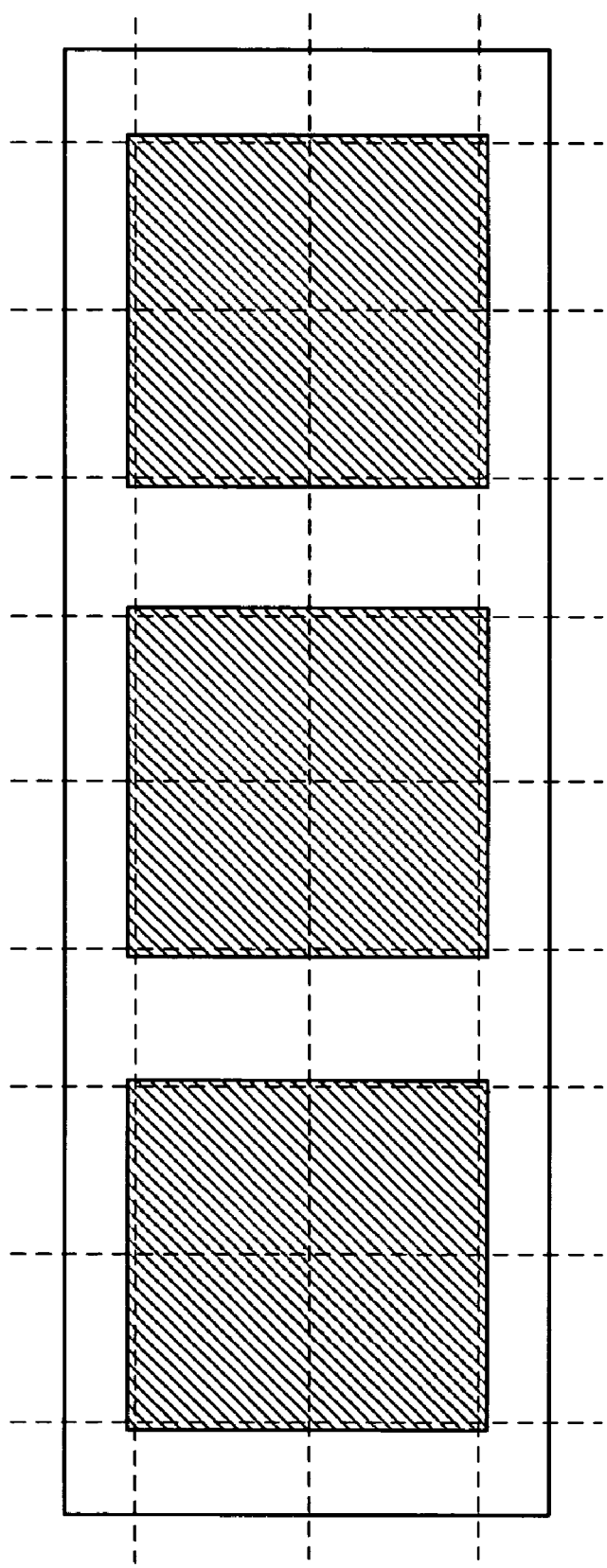
FIG. 13 is a top view of an IC package substrate and mold compound according to some embodiments.

One or more of IC systems 90 through 93 may be singulated after process 40. The dashed lines of FIG. 12 represent a cutting pattern for singulating IC systems 90 through 93. FIG. 13 is a top view of an IC package substrate including IC systems 90 through 93 and further showing the cutting pattern according to some embodiments. Singulation may proceed using any currently- or hereafter-known methods, including saw singulation.

Figure 14:
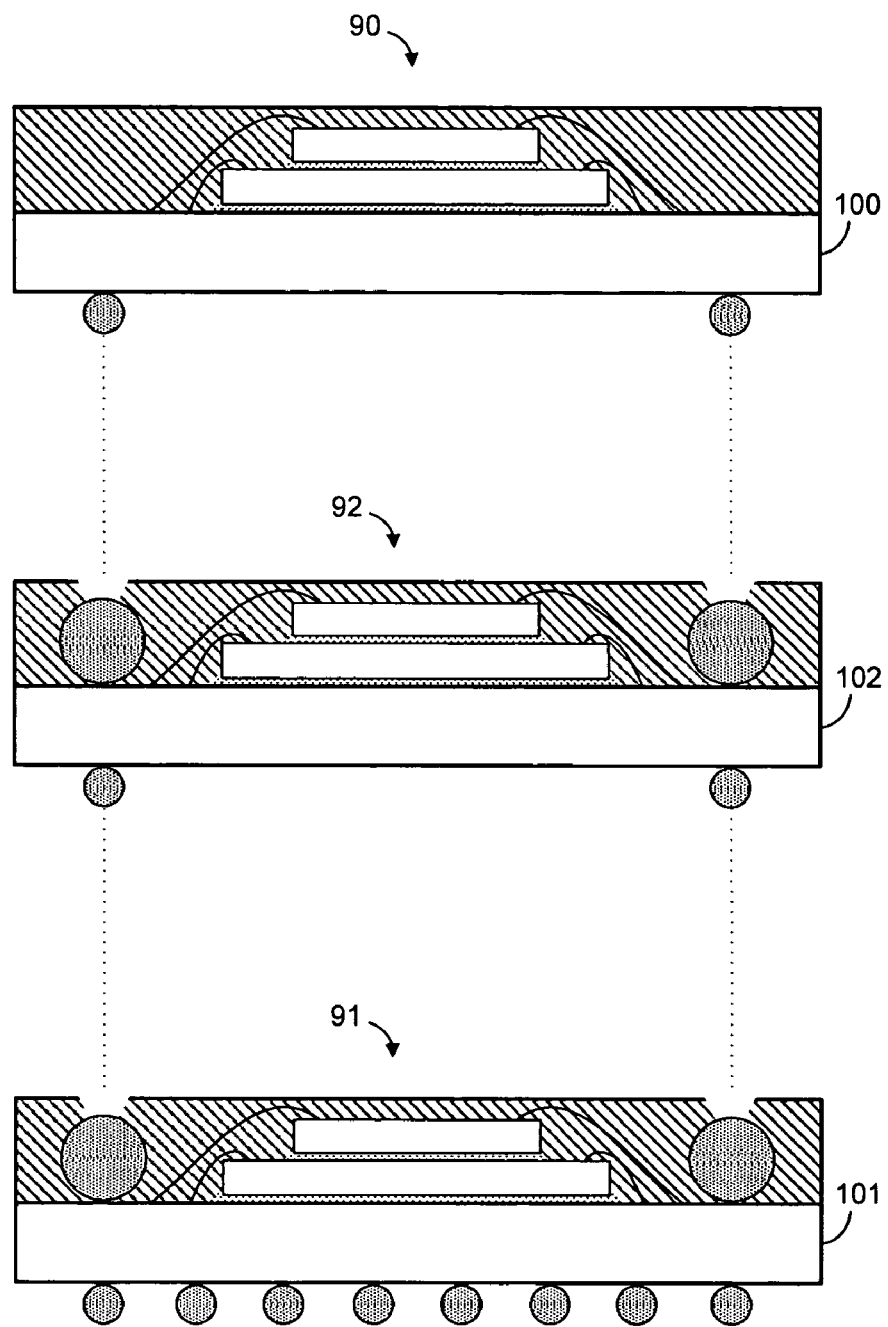
FIG. 14 is a side cross-sectional view of elements of the FIG. 1 apparatus.

FIG. 14 illustrates cross-sectional side views of IC systems 90, 91 and 92 according to some embodiments. IC systems 90, 91 and 92 may be assembled by creating metallurgical bonds between interconnects as indicated by the dotted lines of FIG. 14. Substrates 100 and 102 may also be joined to adjacent mold compound using adhesive. A resulting apparatus is according to some embodiments is illustrated in FIG. 1.

Figure 15:
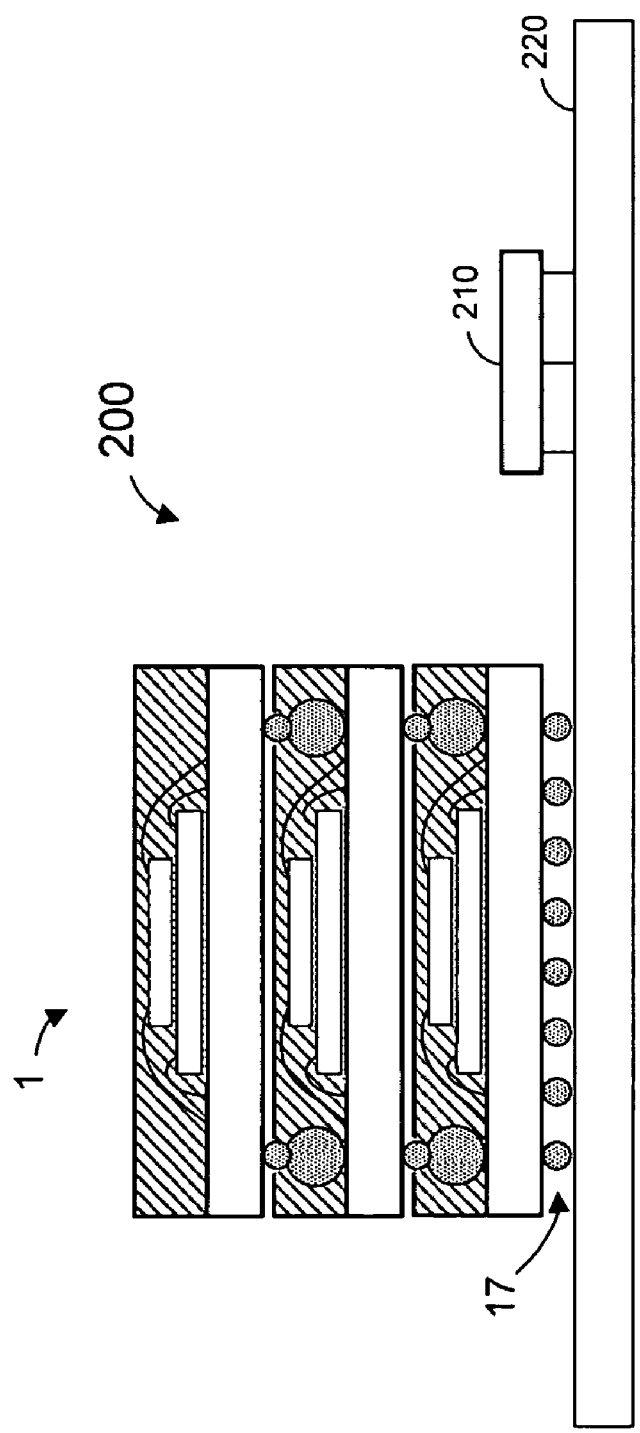
FIG. 15 is a diagram of a system according to some embodiments.

FIG. 15 is a cross-sectional side view of system 200 according to some embodiments. System 200 may comprise components of a mobile computing platform. System 200 includes apparatus 1 as described above, memory 210 and motherboard 220. Apparatus 1 may comprise a "system on a chip", wherein one or more IC die of apparatus 1 comprises a CPU, another one or more IC die comprises a memory, and another one or more IC die comprise an I/O controller. According to some embodiments, one or more IC die of apparatus 1 may be fabricated using a different fabrication process than that used to fabricate at least one other IC die of apparatus 1.

Motherboard 220 may electrically couple memory 210 to an IC die of apparatus 1. More particularly, motherboard 220 may comprise a memory bus (not shown) that is electrically coupled to solder balls 17 and to memory 210. Memory 210 may comprise any type of memory for storing data, such as a Single Data Rate Random Access Memory, a Double Data Rate Random Access Memory, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
    an integrated circuit die;
    an integrated circuit package coupled to the integrated circuit die;
    mold compound in contact with the integrated circuit die and the integrated circuit package;
    a first solder ball in contact with the integrated circuit package;
    a second integrated circuit package; and
    a second solder ball, wherein the second solder ball is in contact with the second integrated circuit package, and in contact with the mold compound,
    wherein the first solder ball comprises a greater radius and a greater circumference than the second solder ball,
    wherein a first portion of the first solder ball is in contact with the mold compound, wherein a second portion of the first solder ball is not in contact with the mold compound, wherein the mold compound defines an opening, wherein the second portion of the first solder ball is recessed beneath the opening, wherein a third portion of the first solder ball is in contact with the integrated circuit package, and wherein the second solder ball is in contact with the first solder ball within the opening.

2. An apparatus according to claim 1, wherein the second portion is an upper portion of the first solder ball and the third portion is a lower portion of the first solder ball.

3. An apparatus according to claim 1, wherein the second integrated circuit package is in contact with the mold compound.

4. An apparatus according to claim 1 further comprising:
a second integrated circuit die in contact with the second integrated circuit package;
second mold compound in contact with the second integrated circuit die and the second integrated circuit package; and
a third solder ball coupled to the second integrated circuit package,
wherein a first portion of the third solder ball is in contact with the second mold compound, and wherein a second portion of the third solder ball is not in contact with the second mold compound, wherein the second mold compound defines a second opening, wherein the second portion of the third solder ball is recessed beneath the second opening, and wherein a third portion of the third solder ball is in contact with the second integrated circuit package.

5. An apparatus according to claim 4, further comprising:
a third integrated circuit package;
a fourth solder ball coupled to the third integrated circuit package,
wherein the fourth solder ball is coupled to the third solder ball within the second opening.

6. An apparatus according to claim 1, further comprising:
a second integrated circuit die coupled to the integrated circuit die, in contact with the mold compound, and electrically coupled to the integrated circuit package.

7. An apparatus comprising:
an integrated circuit package substrate;
a plurality of integrated circuit die coupled to the integrated circuit package substrate;
mold compound in contact with the plurality of integrated circuit die and the integrated circuit package substrate;
a first solder ball in contact with the integrated circuit package substrate and electrically coupled to one of the plurality of integrated circuit die;
a second integrated circuit package; and
a second solder ball, wherein the second solder ball is in contact with the second integrated circuit package, and in contact with the mold compound,
wherein the first solder ball comprises a greater radius and a greater circumference than the second solder ball,
wherein a first portion of the first solder ball is in contact with the mold compound, wherein a second portion of the first solder ball is not in contact with the mold compound, wherein the mold compound defines an opening, wherein the second portion of the first solder ball is recessed beneath the opening, wherein a third portion of the first solder ball is in contact with the integrated circuit package substrate, and wherein the second solder ball is in contact with the first solder ball within the opening.

8. An apparatus according to claim 7, further comprising: die attach material disposed between the first face of each of the plurality of integrated circuit die and the integrated circuit package substrate.

9. An apparatus according to claim 7, further comprising:
a second integrated circuit die in contact with the integrated circuit die, in contact with the mold compound, and electrically coupled to the integrated circuit package.

10. A system comprising:
an integrated circuit die;
an integrated circuit package in contact with the integrated circuit die;
mold compound in contact with the integrated circuit die and the integrated circuit package; and
a first solder ball coupled to the integrated circuit package;
a second integrated circuit die;
a second integrated circuit package;
a second solder ball, wherein the second solder ball is in contact with the second integrated circuit package, and in contact with the mold compound; and
a double data rate memory electrically coupled to the integrated circuit die,
wherein the first solder ball comprises a greater radius and a greater circumference than the second solder ball,
wherein a first portion of the first solder ball is in contact with the mold compound, wherein a second portion of the first solder ball is not in contact with the mold compound, wherein the mold compound defines an opening, wherein the second portion of the first solder ball is recessed beneath the opening, wherein a third portion of the first solder ball is in contact with the integrated circuit package, and wherein the second solder ball is in contact with the first solder ball within the opening.

11. A system according to claim 10, wherein the second integrated circuit package is in contact with the mold compound.

12. A system according to claim 10, further comprising:
a third integrated circuit die in contact with the integrated circuit die, in contact with the mold compound, and electrically coupled to the integrated circuit package.

13. A system according to claim 10, further comprising:
a motherboard electrically coupled to the integrated circuit die and to the memory.

* * * * *